United States Patent
Nagaraj et al.

[11] Patent Number: 5,975,852
[45] Date of Patent: Nov. 2, 1999

[54] THERMAL BARRIER COATING SYSTEM AND METHOD THEREFOR

[75] Inventors: Banalore A. Nagaraj, West Chester; Jon C. Schaeffer, Milford; Mark A. Rosenzweig, Hamilton, all of Ohio

[73] Assignee: General Electric Company, Cincinnati, Ohio

[21] Appl. No.: 08/829,296

[22] Filed: Mar. 31, 1997

[51] Int. Cl.$^6$ ................................................. B32B 15/04
[52] U.S. Cl. .................... 416/241 R; 415/200 R; 416/241 B; 428/141; 428/156; 428/472; 428/701; 428/702; 428/615; 428/623; 428/632; 428/650; 428/552; 428/669; 428/680; 428/652; 428/668; 427/348; 427/402; 427/419.1; 427/419.2
[58] Field of Search .......................... 416/241 B, 241 R; 428/633, 614, 623, 472, 469, 615, 141, 156, 701, 702, 632, 650, 552, 669, 680, 652, 668; 415/200 R; 427/348, 402, 419.1, 419.2, 419.3

[56] References Cited

U.S. PATENT DOCUMENTS

| | | | |
|---|---|---|---|
| 4,399,199 | 8/1983 | McGill et al. | 428/633 |
| 5,116,691 | 5/1992 | Darolia et al. | 428/614 |
| 5,238,752 | 8/1993 | Duderstadt et al. | 416/241 B |
| 5,302,465 | 4/1994 | Miller et al. | 428/552 |
| 5,407,705 | 4/1995 | Vakil | 427/255 |
| 5,427,866 | 6/1995 | Nagaraj et al. | 428/610 |
| 5,498,484 | 3/1996 | Duderstadt | 428/633 |
| 5,512,382 | 4/1996 | Strangman | 428/672 |
| 5,514,482 | 5/1996 | Strangman | 428/623 |
| 5,516,380 | 5/1996 | Darolia et al. | 416/241 R |
| 5,562,998 | 10/1996 | Strangman | 428/612 |
| 5,667,663 | 9/1997 | Rickerby et al. | 205/170 |
| 5,716,720 | 2/1998 | Murphy | 428/623 |
| 5,759,640 | 6/1998 | Mannava et al. | 427/554 |

*Primary Examiner*—Archene Turner
*Attorney, Agent, or Firm*—Andrew C. Hess; David L. Narciso

[57] ABSTRACT

A thermal barrier coating and a method for forming the coating on an article designed for use in a hostile thermal environment, such as turbine, combustor and augmenter components of a gas turbine engine. The method is particularly directed to increasing the spallation resistance of a thermal barrier coating system that includes a thermal insulating ceramic layer. The coating system of this invention generally includes a nickel aluminide alloy on which an aluminum oxide layer is formed, over which a ceramic layer is deposited so as to overlie and contact the aluminum oxide layer. The coating system does not include a bond coat, such as a diffusion aluminide or MCrAlY coating known in the prior art. The nickel aluminide alloy may be a binary NiAl alloy consisting essentially of nickel and aluminum in stoichiometric amounts, or may contain one or more oxygen-active elements. The NiAl alloy may be provided as a monolithic layer on a superalloy, or may be the base material for the article on which the thermal barrier coating is formed.

20 Claims, 1 Drawing Sheet

THERMAL BARRIER COATING SYSTEM AND METHOD THEREFOR

This invention relates to thermal barrier coating systems for components exposed to high temperatures, such as the hostile thermal environment of a gas turbine engine. More particularly, this invention is directed to a thermal barrier coating system that comprises a thermal insulating ceramic layer deposited directly on a nickel aluminide substrate, particularly a single-crystal nickel aluminide, and therefore without an adhesion-promoting bond coat.

BACKGROUND OF THE INVENTION

Higher operating temperatures for gas turbine engines are continuously sought in order to increase their efficiency. However, as operating temperatures increase, the high temperature durability of the components of the engine must correspondingly increase. Significant advances in high temperature capabilities have been achieved through formulation of nickel and cobalt-base superalloys, though such alloys alone are often inadequate to form components located in certain sections of a gas turbine engine, such as the turbine, combustor and augmentor. A common solution is to thermally insulate such components in order to minimize their service temperatures. For this purpose, thermal barrier coatings (TBC) formed on the exposed surfaces of high temperature components have found wide use.

To be effective, thermal barrier coatings must have low thermal conductivity, strongly adhere to the article, and remain adherent throughout many heating and cooling cycles. The latter requirement is particularly demanding due to the different coefficients of thermal expansion between materials having low thermal conductivity and superalloy materials typically used to form turbine engine components. Thermal barrier coating systems capable of satisfying the above requirements have generally required a metallic bond coat deposited on the component surface, followed by an adherent ceramic layer that serves to thermally insulate the component. In order to promote the adhesion of the ceramic layer to the component and inhibit oxidation of the underlying superalloy, the bond coat is typically formed from an oxidation-resistant aluminum-based intermetallic such as a diffusion aluminide or platinum aluminide, or by an oxidation-resistant aluminum-containing alloy such as MCrAlY (where M is iron, cobalt and/or nickel).

Various ceramic materials have been employed as the ceramic layer, particularly zirconia ($ZrO_2$) stabilized by yttria ($Y_2O_3$), magnesia (MgO) or other oxides. These particular materials are widely employed in the art because they can be readily deposited by plasma spray, flame spray and electron beam vapor deposition (EBPVD) techniques, have low coefficients of thermal expansion, and when processed properly show good adhesion to substrate materials. In order to increase the resistance of the ceramic layer to spallation when subjected to thermal cycling, the prior art has proposed various improved coating systems, with considerable emphasis on ceramic layer microstructures having enhanced strain tolerance as a result of the presence of porosity, microcracks and segmentation of the ceramic layer. Thermal barrier coating systems employed in higher temperature regions of a gas turbine engine are typically deposited by physical vapor deposition (PVD) techniques that yield a grain structure that is able to expand without causing damaging stresses that lead to spallation.

The bond coat is also critical to promoting the spallation resistance of a thermal barrier coating system. As noted above, bond coats provide an oxidation barrier for the underlying superalloy substrate. Conventional bond coat materials contain aluminum, such as the diffusion aluminides and MCrAlY alloys noted above, which enables such bond coats to oxidize and grow a strong adherent continuous aluminum oxide layer (alumina scale). The aluminum oxide layer chemically bonds the ceramic layer to the bond coat, and protects the bond coat from oxidation and hot corrosion. Though bond coat materials are particularly alloyed to be oxidation-resistant, oxidation inherently occurs over time at elevated temperatures, which gradually depletes aluminum from the bond coat. In addition, aluminum is lost from the bond coat as a result of interdiffusion into the superalloy substrate. Eventually, the level of aluminum within the bond coat is sufficiently depleted to prevent further growth of oxide, at which time spallation may occur at the interface between the bond coat and the aluminum oxide layer or the interface between the oxide layer and the ceramic layer.

In addition to depletion of aluminum, the ability of the bond coat to form the desired aluminum oxide layer can be hampered by the diffusion of elements from the superalloy into the bond coat, such as during formation of a diffusion aluminide coating or during high temperature exposure. Oxidation of such elements within the bond coat can become thermodynamically favored as the aluminum within the bond coat is depleted through oxidation and interdiffusion. Elements such as nickel, chromium, titanium, tantalum, tungsten, molybdenum and hafnium can increase the growth rate of aluminum oxide and form voluminous, nonadherent scales that may be deleterious to adhesion of the ceramic layer.

From the above, it is apparent that the service life of a thermal barrier coating is dependent on the bond coat used to anchor the thermal insulating ceramic layer. Once spallation of the ceramic layer has occurred, the component must be refurbished or scrapped at considerable cost. Therefore, it would be desirable if further improvements were possible for the service life of a thermal barrier coating system.

SUMMARY OF THE INVENTION

It is an object of this invention to provide a novel thermal barrier coating system and a method for forming the coating system on an article designed for use in a hostile thermal environment.

It is another object of this invention that the coating system does not include a bond coat.

It is yet another object of this invention that the coating system entails the formation of a thermal insulating ceramic layer on a surface formed by a beta-phase nickel aluminide alloy.

It is a further object of this invention that the nickel aluminide alloy forms the article or a layer on the article.

The present invention generally provides a thermal barrier coating system and a method for forming the coating system on an article designed for use in a hostile thermal environment, such as turbine, combustor and augmentor components of a gas turbine engine. The method is particularly directed to increasing the spallation resistance of a thermal barrier coating system that includes a thermal insulating ceramic layer.

The thermal barrier coating system of this invention generally includes a nickel aluminide alloy of predominantly the beta (β) NiAl phase and on which an aluminum oxide layer is formed, over which a ceramic layer is deposited so as to overlie and contact the aluminum oxide layer. Notably, the coating system does not include a bond coat, such as diffusion aluminide and MCrAlY coatings known in the prior art. According to the invention, the nickel aluminide alloy may be a binary NiAl alloy consisting essentially of nickel and aluminum in stoichiometric amounts, or may contain an oxygen-active element, such as yttrium, cerium, zirconium or hafnium, to strengthen the NiAl alloy. Also according to this invention, a component on which the thermal barrier coating is formed may be formed entirely by the nickel aluminide alloy, such as a single-crystal investment casting. Alternatively, the component may be formed by a superalloy on which the nickel aluminide alloy is provided as a monolithic surface layer.

The processing steps of the invention generally include providing a component whose surface is formed by the nickel aluminide alloy, forming an aluminum oxide layer on the nickel aluminide alloy, and then depositing a ceramic layer on the oxide layer. Prior to developing the oxide layer, the surface of the nickel aluminide alloy is preferably treated to have a surface finish of not greater than about 25 microinches (about 0.6 micrometer) $R_a$, such as by electropolishing, vapor honing, polishing or light abrasive blasting.

According to this invention, a thermal barrier coating system is capable of exhibiting enhanced service life and spallation resistance when a nickel aluminide alloy serves as the substrate on which an aluminum oxide layer is grown and on which a ceramic layer is deposited. Notably, this invention completely omits a traditional aluminum-based bond coat, instead using a substantially monolithic NiAl intermetallic from which the component is formed or which forms a thick layer on the component. A substantially monolithic layer of NiAl may be formed on a component using a process such as, but not limited to, diffusion bonding an NiAl foil, plasma spraying, physical vapor deposition or sputtering. As such, the invention completely avoids interactions that typically occur between bond coats and a superalloy substrate on which such bond coats are formed. In addition, NiAl intermetallic alloys provide a large reservoir for formation of the desired aluminum oxide scale, and are free of elements that might otherwise form voluminous nonadherent oxides that would otherwise promote spallation. The result is a thermal barrier coating system whose thermal cycle life has been surprisingly found to be up to about ten times greater than conventional coating systems. Finally, elimination of the bond coat also yields significant savings in manufacturing cost and time.

Other objects and advantages of this invention will be better appreciated from the following detailed description.

BRIEF DESCRIPTION OF THE DRAWINGS

The present invention will now be described, by way of example, with reference to the accompanying drawings, in which.

DETAILED DESCRIPTION OF THE INVENTION

Figure 1:
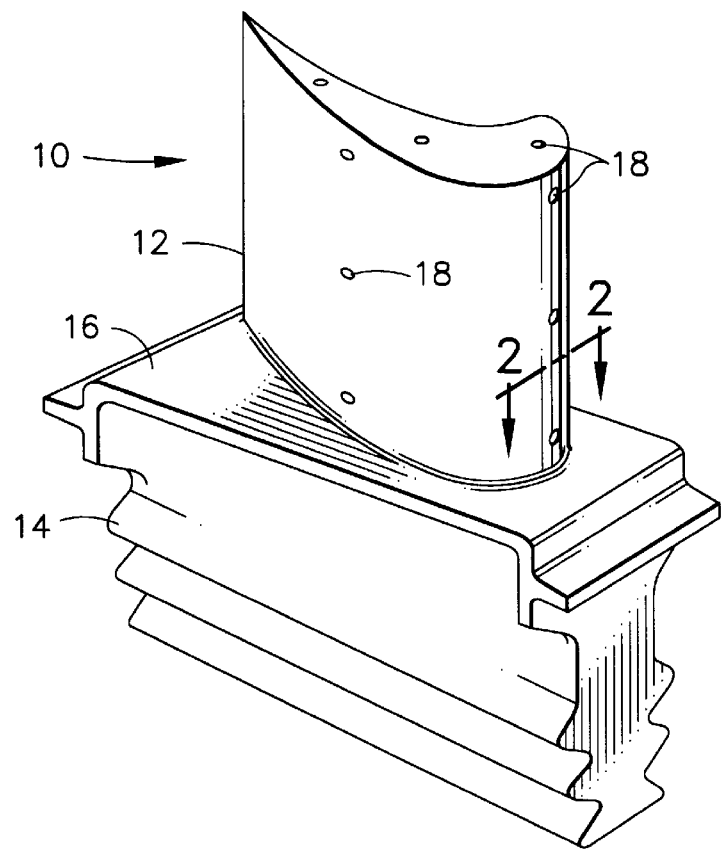
FIG. 1 is a perspective view of a high pressure turbine blade.

The present invention is generally applicable to components that operate within environments characterized by relatively high temperatures, and are therefore subjected to severe thermal stresses and thermal cycling. Notable examples of such components include the high and low pressure turbine nozzles and blades, shrouds, combustor liners and augmentor hardware of gas turbine engines. One such example is the high pressure turbine blade 10 shown in FIG. 1. The blade 10 generally includes an airfoil 12 against which hot combustion gases are directed during operation of the gas turbine engine, and whose surface is therefore subjected to severe attack by oxidation, corrosion and erosion. The airfoil 12 is anchored to a turbine disk (not shown) with a dovetail 14 formed on a root section 16 of the blade 10. Cooling passages 18 are present in the airfoil 12 through which bleed air is forced to transfer heat from the blade 10. While the advantages of this invention will be described with reference to the high pressure-turbine blade 10 shown in FIG. 1, the teachings of this invention are generally applicable to any component on which an environmental or thermal barrier coating system may be used to protect the component from its environment.

Figure 2:
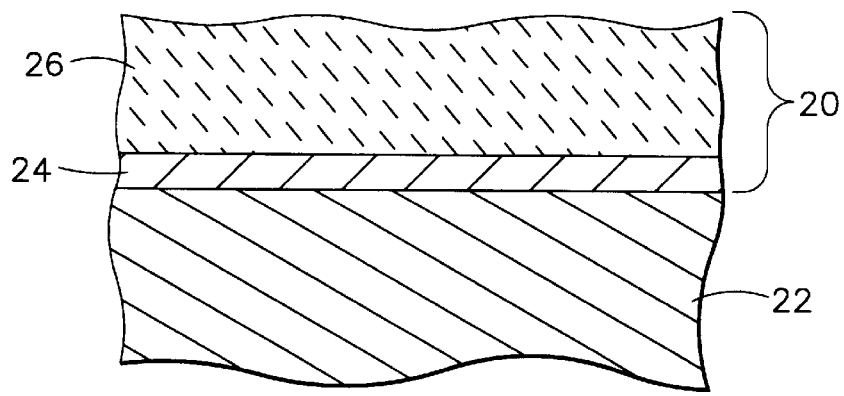
FIG. 2 is a cross-sectional view of the blade of FIG. 1 along line 2—2, and shows a thermal barrier coating on the blade in accordance with this invention.

Represented in FIG. 2 is a thermal barrier coating system 20 in accordance with this invention. As shown, the coating system 20 includes a ceramic layer 26 bonded to a substrate 22 with an aluminum oxide layer 24. According to the invention, the substrate 22 is a nickel aluminide alloy of predominantly the beta NiAl phase, and may be in the form of a single-crystal casting that forms the entire blade 10. Alternatively, the substrate 22 can be limited to a layer on the surface of the blade 10, which can be formed of a suitable high-temperature material, such as a nickel or cobalt-base superalloy. In this embodiment of the invention, the NiAl substrate 22 can be formed using a suitable deposition process, including low pressure plasma spraying (LPPS), diffusion bonding, sputtering and electron beam evaporation. A minimal thickness for an NiAl layer is about 125 micrometers in order to provide an adequate supply of aluminum for oxide formation, as will be discussed below.

A novel feature of this invention is that the thermal barrier coating system 20 is formed directly on the NiAl substrate 22 without a bond coat, such as the diffusion aluminide and MCrAlY alloys conventionally required in the prior art. As such, the substrate 22 is not prone to interactions and interdiffusion of elements observed with prior art bond coats and their superalloy substrates. An optional noble metal layer between the NiAl substrate 22 and the ceramic layer 26, with a thickness of about 4 to about 10 micrometers, may be included to promote formation of desirable oxides and thereby improve the environmental resistance of the substrate 22. This layer would not be deemed a bond coat in accordance with the accepted definition in the art, because such a thin layer of noble metal (e.g., platinum, rhodium, palladium) would quickly diffuse into the substrate 22 during high temperature processing and service.

To attain a strain-tolerant columnar grain structure, the ceramic layer 26 is preferably deposited by physical vapor deposition using techniques known in the art. A preferred material for the ceramic layer 26 is an yttria-stabilized zirconia (YSZ), a preferred composition being about 6 to about 8 weight percent yttria, though other ceramic materials could be used, such as yttria, nonstabilized zirconia, or zirconia stabilized by ceria ($CeO_2$) or scandia ($Sc_2O_3$). The ceramic layer 26 is deposited to a thickness that is sufficient to provide the required thermal protection for the underlying substrate 22 and blade 10, generally on the order of about 125 to about 300 micrometers.

As with prior art bond coats, the surface of the NiAl substrate 22 oxidizes to form the aluminum oxide layer 24 to which the ceramic layer 26 chemically bonds. As a monolithic NiAl alloy, as opposed to a superalloy or diffusion layer that may contain dispersions of aluminides, the substrate 22 provides a large reservoir from which the oxide layer 24 is formed. The substrate 22 can be formed of the binary NiAl intermetallic, or may be alloyed to contain selected elements such as tantalum and hafnium to improve the mechanical and/or physical properties of the substrate 22. In addition, the NiAl alloy may be alloyed to contain one or more oxygen-active elements, such as yttrium, hafnium, cerium, zirconium and others, to promote adherence of the aluminum oxide layer 24.

According to this invention, the NiAl substrate 22 is processed to provide a very smooth, contaminant-free interface with the ceramic layer 26, which has been found to unexpectedly promote spallation resistance of the ceramic layer 26. In particular, superior results have been achieved by processing the surface of the substrate 22 by electropolishing, vapor honing, polishing or light grit blasting to yield a surface finish of not more than about 25 microinches (about 0.6 micrometer) $R_a$. Such results are unexpected in view of the traditional belief that a rough interface, e.g., an $R_a$ of at least 50 microinches, is required to achieve acceptable resistance to spallation with diffusion aluminide bond coats.

During the evaluation of this invention, single-crystal NiAl alloy specimens and a single-crystal nickel-base superalloy specimen were provided with thermal barrier coating systems that included a thermal insulating ceramic layer of yttria-stabilized zirconia (YSZ) deposited by physical vapor deposition. The coating system for the superalloy specimen was also conventionally formed to include a diffusion aluminide bond coat whose surface was grit blasted to attain a conventionally-suitable surface roughness of about 50 microinches $R_a$. In contrast, ceramic layers for the NiAl specimens were deposited directly on the surfaces of the NiAl alloy, i.e., without a bond coat. During deposition of the ceramic layers, an oxide layer of about 0.2 to about 0.5 micrometer was developed. Three different NiAl alloys were evaluated, and their surfaces were prepared for deposition of the ceramic layer by either electropolishing or vapor honing as indicated in Table I. Spallation resistance of the coating systems were evaluated by thermal cycling between room temperature and about 2075° F. (about 1135° C.). All of the NiAl alloys were the beta-phase NiAl intermetallic, with specific compositions for the NiAl alloys indicated in Table I in atomic percents.

TABLE I

| SPECIMEN | SURFACE PREPARATION | CYCLES |
|---|---|---|
| Ni-base superalloy + Diffusion Aluminide | Grit Blasted | 391 |
| Ni-50Al | Electropolished | 2180 |
| Ni-50Al-0.1Y | Electropolished | 2040 |
| Ni-49.8Al-0.5Hf | Electropolished | 6000+ |
| Ni-49.8Al-0.5Hf | Vapor Honed | 8000+ |

"Cycles" denotes the number of cycles survived without spallation of the thermal barrier coating. Testing of the Ni-49.8Al-0.5Hf alloys was discontinued without spallation having occurred.

From the above, it can be seen that the thermal barrier coatings of the NiAl specimens were considerably more resistant to spallation than the Ni-base superalloy with a conventional diffusion aluminide bond coat. These results were unexpected, in that a large mismatch in coefficients of thermal expansion exists between that of the NiAl alloys and the ceramic thermal barrier coating. The anisotropy of the single-crystal NiAl specimens was also expected to reduce the spallation resistance of the thermal barrier coatings of the NiAl specimens. The above results were also unexpected because the surfaces of the NiAl alloys were prepared contrary to industry practice, in that a smoother surface yielded enhanced spallation resistance. Both electropolishing and vapor honing produced a smooth surface (an $R_a$ of about 10 to about 25 microinches, about 0.25 to about 0.6 micrometer) that was generally free of contaminants. In contrast, the diffusion aluminide bond coat of the Ni-base superalloy was prepared in accordance with standard practice to have a surface finish of about 50 microinches $R_a$.

The results shown in Table I also indicate the beneficial effect of including about 0.5 atomic percent of an oxygen-active element to the NiAl alloy. The Ni-49.8Al-0.5Hf alloys resulted in thermal cycle lives that were longer than that for the stoichiometric NiAl alloy, and considerably longer than the Ni-base superalloy with the bond coat. While the Ni-50Al-0.1Y alloy did not exhibit an improved life over the stoichiometric NiAl alloy, the results of the Ni-49.8Al-0.5Hf alloys were concluded to indicate that improved results are obtained if one or more oxygen-active elements are present at levels greater than about 0.1 atomic percent. Accordingly, while NiAl alloys with 0.5 atomic percent hafnium were evaluated, it is believed that similar results would be obtained with NiAl alloys that include about 0.05 to about 1.0 atomic percent of any oxygen-active element, such as yttrium, hafnium, cerium, zirconium, etc.

While our invention has been described in terms of a preferred embodiment, it is apparent that other forms could be adopted by one skilled in the art. Accordingly, the scope of our invention is to be limited only by the following claims.

What is claimed is:

1. A component formed of single-crystal nickel aluminide intermetallic and having a thermal barrier coating system on a surface thereof, the thermal barrier coating system consisting of
    an aluminum oxide layer on the nickel aluminide intermetallic, and
    a ceramic layer overlying and contacting the aluminum oxide layer.

2. A component as recited in claim 1, wherein the nickel aluminide intermetallic is a binary NiAl intermetallic consisting essentially of nickel and aluminum in stoichiometric amounts.

3. A component as recited in claim 1, wherein the nickel aluminide intermetallic contains about 0.05 to about 1.0 atomic percent of at least one oxygen-active element.

4. A component as recited in claim 1, wherein the nickel aluminide intermetallic contains about 0.5 atomic percent hafnium.

5. A component as recited in claim 1, wherein the surface of the component has a surface finish of not greater than 25 microinches $R_a$.

6. A component as recited in claim 1, wherein the nickel aluminide intermetallic is Ni-49.8Al-0.5Hf.

7. A component as recited in claim 1, further comprising a noble metal diffusion layer in the surface of the nickel aluminide intermetallic and beneath the aluminum oxide layer.

8. A gas turbine engine component formed of single-crystal nickel aluminide intermetallic of predominantly the beta phase with about 0.05 to about 1.0 atomic percent of at least one oxygen-active element chosen from the group consisting essentially of yttrium, hafnium, cerium and zirconium, the component having a thermal barrier coating system on a surface thereof, the thermal barrier coating system consisting of an aluminum oxide layer grown directly from the nickel aluminide intermetallic; and a ceramic layer adhered to the nickel aluminide intermetallic by the aluminum oxide layer.

9. A component as recited in claim 8, wherein the nickel aluminide intermetallic contains about 0.5 atomic percent hafnium.

10. A component as recited in claim 8, wherein the surface of the component has a surface finish of not greater than 25 microinches $R_a$.

11. A component as recited in claim 8, further comprising a noble metal diffusion layer in the surface of the component beneath the aluminum oxide layer.

12. A component as recited in claim 8, wherein the single-crystal beta-phase nickel aluminide intermetallic is Ni-49.8Al-0.5Hf.

13. A method comprising the steps of:

forming a component of single-crystal nickel aluminide intermetallic;

forming an aluminum oxide layer on a surface of the component; and forming a ceramic layer on the aluminum oxide layer.

14. A method as recited in claim 13, wherein the nickel aluminide intermetallic contains about 0.05 to about 1.0 atomic percent of at least one oxygen-active element.

15. A method as recited in claim 13, wherein the nickel aluminide intermetallic contains about 0.5 atomic percent hafnium.

16. A method as recited in claim 13, wherein the nickel aluminide intermetallic is Ni49.8Al-0.5Hf.

17. A method as recited in claim 13, wherein the nickel aluminide intermetallic is of predominantly the beta phase.

18. A method as recited in claim 13, further comprising the step of surface finishing the nickel aluminide intermetallic to have a surface finish of not greater than about 25 microinches $R_a$.

19. A method as recited in claim 18, wherein the surface finishing step entails an electropolishing, vapor honing or abrasive blasting technique.

20. A method as recited in claim 13, the method further comprising the step of forming a noble metal diffusion layer in the surface of the component so as to be beneath the aluminum oxide layer.

* * * * *